United States Patent [19]
Kimura et al.

[11] Patent Number: 5,702,764
[45] Date of Patent: Dec. 30, 1997

[54] METHOD FOR THE PREPARATION OF PYROLYTIC BORON NITRIDE-CLAD DOUBLE-COATED ARTICLE

[75] Inventors: Noboru Kimura; Ryouji Iwai, both of Gunma-ken, Japan

[73] Assignee: Shin-Etsu Chemical Co., Ltd., Tokyo, Japan

[21] Appl. No.: 701,563

[22] Filed: Aug. 22, 1996

Related U.S. Application Data

[63] Continuation of Ser. No. 357,858, Dec. 16, 1994, abandoned.

[30] Foreign Application Priority Data

Dec. 22, 1993 [JP] Japan ................. 5-324777

[51] Int. Cl.⁶ ........................................ C23C 16/00
[52] U.S. Cl. ................. 427/248.1; 427/299; 427/249; 427/255.7; 427/402
[58] Field of Search .................. 427/248.1, 299, 427/255.1, 255.2, 402, 255.7, 249; 219/543

[56] References Cited

U.S. PATENT DOCUMENTS

| | | | |
|---|---|---|---|
| 5,075,055 | 12/1991 | Finicle | 264/81 |
| 5,331,134 | 7/1994 | Kimura | 219/543 |
| 5,343,022 | 8/1994 | Gilbert et al. | 219/552 |

*Primary Examiner*—Roy V. King
*Attorney, Agent, or Firm*—McAulay Fisher Nissen Goldberg & Kiel, LLP

[57] ABSTRACT

An improvement is proposed in the method for the preparation of a ceramic heater consisting of a substrate of boron nitride, patterned graphite layer thereon as an electric resistance heater element and an overall cladding layer of pyrolytic boron nitride formed on allover the surface after pattern-wise engraving of the graphite layer and the substrate in order to enhance the stability of the cladding layer against crack formation or exfoliation. The improvement is achieved by limiting the depth of engraving not to exceed 200 μm or chamfering and rounding of the edged and recessed ridge lines formed by engraving so that the cross sectional profile is in a smooth contour having a radius of curvature not smaller than 0.5 mm.

3 Claims, 2 Drawing Sheets

METHOD FOR THE PREPARATION OF PYROLYTIC BORON NITRIDE-CLAD DOUBLE-COATED ARTICLE

This is a continuation of application Ser. No. 08/357,858, filed Dec. 16, 1994, now abandoned.

BACKGROUND OF THE INVENTION

The present invention relates to a method for the preparation of a pyrolytic boron nitride-clad double-coated article useful as a heater element, electrostatic chuck, thermal radiation-shielding board or cylinder, vessel provided with a heat sink and the like. More particularly, the invention relates to a method for the preparation of a shaped article double-coated, first, with a graphite layer and, second, with a layer of pyrolyric boron nitride on a substrate of boron nitride and suitable for the above mentioned applications.

Pyrolyric boron nitride, referred to as PBN hereinafter, is a material produced by the chemical vapor deposition (CVD) method and has excellent heat resistance, corrosion resistance and chemical stability as well as extremely high purity not to cause contamination of bodies in contact therewith even at an elevated temperature with the impurities contained therein. Various kinds of appliances have been developed heretofore by utilizing the excellent properties of PBN by forming a PBN layer on the surface of a substrate of a material such as graphite or a sintered body of a ceramic such as alumina, silicon nitride, silicon carbide, boron nitride and the like. For example, Japanese Patent Kokai No. 54-10781 discloses a graphite boat provided with a cladding layer of PBN suitable for a receptacle in a heat treatment. Alternatively, PBN-clad double-coated articles, in which the substrate body is first provided with a layer of pyrolytic graphite, referred to as PG hereinafter, then with a cladding layer of PBN, have been developed. For example, Japanese Utility Model Kokai No. 3-30393 discloses a heater element having a double-layered structure consisting of a substrate of PBN and an undercoating layer of PG and provided with an insulating layer of PBN. Further, Japanese Patent Kokai No. 5-105557 discloses a PBN-made vessel provided with a heat sink layer of PG and an insulating protective layer of PBN.

A serious problem common in the above mentioned PBN-clad articles is that an internal stress is produced in the cladding layer of PBN, especially, in the edged corner or ridge portions of the article sometimes to cause crack formation in and exfoliation of the PBN cladding layer. This problem is so serious that the durability of PBN-clad articles is unduly decreased necessarily to cause a decrease in the productivity and an increase in the costs of the process using the articles. It is eagerly desired, accordingly, to develop a method for the preparation of a PBN-clad double-coated articles free from these problems and disadvantages.

SUMMARY OF THE INVENTION

The present invention accordingly has an object to provide a method for the preparation of a PBN-clad double-coated article consisting of a substrate of boron nitride provided first with an undercoating layer of graphite and then with a cladding layer of PBN and free from the above described problems and disadvantages in the prior art.

Thus, the present invention provides, in a method for the preparation of a PBN-clad double-coated article comprising the steps of forming an undercoating layer of graphite on the surface of a substrate of boron nitride having an edged or recessed corner or ridge portion and then forming a cladding layer of pyrolytic boron nitride by the method of chemical vapor deposition, an improvement which comprises smoothing the surface of the substrate to have a ruggedness not exceeding 200 μm in the height difference between the top of the protrusion and the bottom of the recess or chamfering and rounding the corner or ridge portion such that the radius of curvature thereof is not smaller than 0.5 mm.

DETAILED DESCRIPTION OF THE PREFERRED EMBODIMENTS

After detailed investigations on the mechanism of the disadvantageous crack formation in and exfoliation of the PBN-cladding layer in the double-coated articles, the inventors have arrived at a discovery that the internal stress caused in the PBN cladding layer on the graphite-undercoated substrate of sintered boron nitride is concentrated in the edged corner or ridge portions and the portions where the graphite-undercoated substrate surface has a large ruggedness leading to the completion of the present invention after detailed studies on the means to achieve dispersion of the internal stress in the PBN-cladding layer. Namely, the improvement according to the present invention can be achieved by a finishing treatment of the graphite-undercoated substrate relative to the ruggedness of the surface and/or the radius of curvature in the edged corner or ridge portion as described above. Such a PBN-clad double-coated boron nitride article is safe from the troubles due to crack formation in and exfoliation of the PBN cladding layer so that the method according to the invention is useful for the preparation of a ceramic-based heater element, electrostatic chuck, thermal radiation-shielding board or cylinder, vessel with a heat sink and so on.

The investigations undertaken by the inventors for the mechanism leading to the crack formation in and exfoliation of the PBN-cladding layer mentioned above have led to a conclusion that these troubles are due to the internal stress in the cladding layer which is concentrated around the edged or recessed corner or ridge portions and in the areas where the underlying surface has a relatively large ruggedness.

Figure 3A:
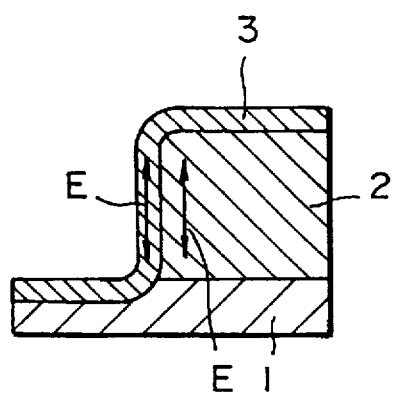
FIGS. 3a and 3b are each an illustration of the internal stress generated in the PBN-cladding layer by way of a cross sectional view.
Figure 3B:
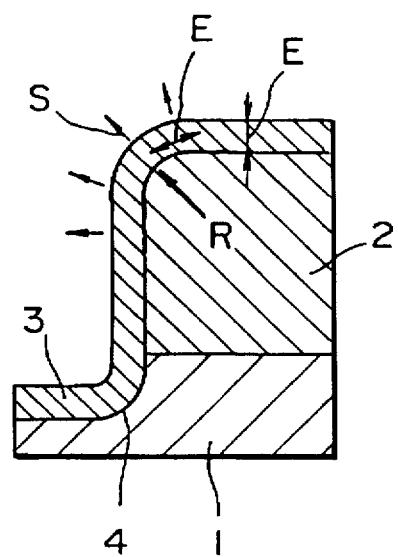

As is schematically illustrated in FIG. 3b showing a cross sectional view of a PBN-clad article consisting of a substrate 1 of sintered boron nitride having an undercoating layer 2 of graphite and provided with a cladding layer 3 of PBN, the internal stress, shown by the arrows S, is concentrated, on one hand, more or less around the corner portion having a radius of curvature R. This phenomenon is due to the anisotropy in the PBN-cladding layer formed by the CVD method. It has been discovered that the internal stress S is larger when the PBN-cladding layer 3 has greater anisotropy, when the thickness of the PBN-cladding layer 3 is larger and the radius of curvature R in the corner portion is smaller. Among these three factors, the anisotropy of the PBN-cladding layer 3 is an inherency in the CVD-deposited PBN layer so that the anisotropy cannot be freely controlled. The thickness of the PBN-cladding layer 3 also cannot be small enough not to give a solution For the troubles because, when the thickness is too small, the cladding layer 3 can no longer provide protection to the underlying surface 2 as a matter of course. Accordingly, the only measure to solve the problem is to increase the radius of curvature R as far as possible. The detailed studies on the advantageous influences obtained by increasing the radius of curvature is particularly remarkable when the radius of curvature R is at least 0.5 min.

On the other hand, the internal stress in the PBN-cladding layer is concentrated, as is shown in FIG. 3a, on the areas where the surface of the underlying layer has a relatively large protrusion having a large difference in the height between fie top of a protrusion and the bottom of a recess. As is mentioned above, a CVD-deposited PBN-cladding layer has anisotropy in respect of the thermal expansion coefficient, indicated by the double-sided arrows E in FIGS. 3a and 3b, which is about 10 times larger in the growing direction of fie layer by the deposition of PBN in the CVD process than in the direction perpendicular to the growing direction of the layer in the CVD deposition. When the surface of the substrate made from sintered boron nitride is perpendicular to the growing direction of the PBN-cladding layer, substantial coincidence can be obtained in the thermal expansion coefficient between the substrate surface and the PBN-cladding layer, accordingly, but, when the surface of a substrate of sintered boron nitride is in parallel with the growing direction of the PBN-cladding layer, as is the case on the rising side surface of a protrusion due to ruggedness of the surface, an up to about 10 times difference is caused in the thermal expansion coefficient between the substrate surface and the PBN-cladding layer so that the internal stress generated in the PBN-cladding layer is increased so much as the height of the protrusion formed by the ruggedness of the surface is increased. In FIG. 3a, for example, the substrate 1 of sintered boron nitride is first provided with a uniform undercoating layer 2 of graphite, which is then engraved to form a groove making a surface of graphite perpendicular to the substrate surface, and a PBN-cladding layer 3 is formed thereon by the CVD method to grow in the direction perpendicular to the surface of the substrate 1 but in the direction parallel to the side surface of the graphite layer 2 exposed by the engraving work of the layer 2 to form a groove. When the thus PBN-clad double-coated article is cooled from the temperature for the CVD deposition of PBN to room temperature, accordingly, a great internal stress is generated there unavoidably. This problem can be solved by finishing the surface of the graphite-coated substrate such that the height difference between the top of a highest protrusion and the bottom of a deepest recess caused by the ruggedness of the surface does not exceed 200 µm.

Figure 1A:
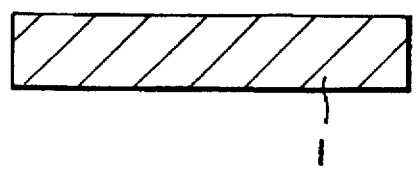
FIGS. 1a to 1f illustrate the steps for the formation of a PBN cladding layer on the substrate of boron nitride provided with an undercoating layer of graphite.
Figure 1B:
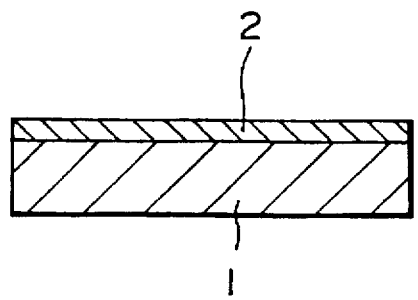
Figure 1C:
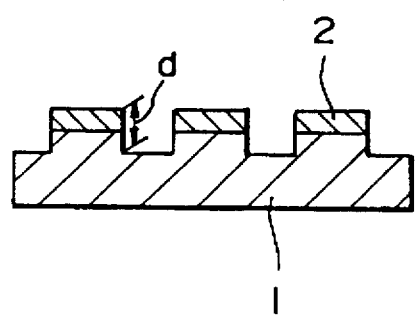
Figure 1D:
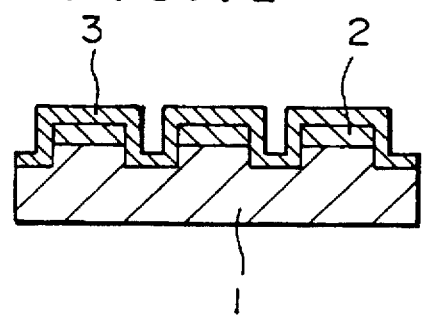

The very feature of the present invention, in an aspect, consists in that, in order to minimize the internal stress in the PBN-cladding layer, the height difference d between the top and bottom of a protrusion or raised portion shown in FIG. 1c formed by the mechanical working of engraving and grinding of the double-layered body before formation of the PBN-cladding layer is limited not to exceed 200 µm. When this height difference exceeds 200 µm, crack formation in or exfoliation of the PBN-cladding layer takes place due to the loss of the stress-relieving effect.

Figure 1E:
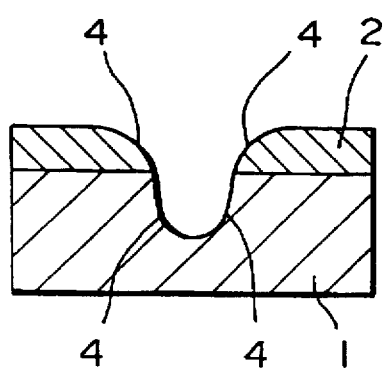

The feature of the inventive method, in another aspect, consists in that, as is illustrated in FIG. 1e, the radius of curvature of a corner or ridge portion is limited not to be smaller than 0.5 mm, especially, when a substantial ruggedness on the surface cannot be avoided to meet the requirement in the first aspect mentioned above. When the radius of curvature is smaller than 0.5 mm along a corner or ridge portion, crack formation and exfoliation sometimes take place in the corner or ridge portion.

In the double-layered body consisting of a substrate and an undercoating layer of graphite, on which the cladding layer of PBN is formed according to the invention, the substrate is made from boron nitride which can be PBN or sintered boron nitride and the graphite layer can be formed from the pyrolyric graphite or by the graphitization of amorphous carbon formed by the thermal decomposition of an organic polymeric material.

In the following, the working procedure according to the inventive method is illustrated in more detail making reference to FIGS. 1a to 1f of the accompanying drawing each showing a vertical cross sectional view.

As is illustrated in FIG. 1b, a layer of graphite 2 having a thickness of 50 to 100 µm is formed on one surface of the boron nitride substrate 1 shown in FIG. 1a, for example, by the CVD method of methane gas. As is shown in FIG. 1c, the graphite layer 2 is engraved line-wise by using a milling machine in a pattern of a resistance element of an electric heater to such a depth that the boron nitride substrate 1 is also engraved in the form of a groove together with the graphite layer 2. In this case, it is essential that the depth of engraving indicated by d in FIG. 1c does not exceed 200 µm. Finally, a protective layer of PBN is formed to cover the whole surface including the top and side surfaces of the graphite-coated line protrusion and the bottom surface of the groove where the boron nitride substrate is exposed by engraving.

Figure 1F:
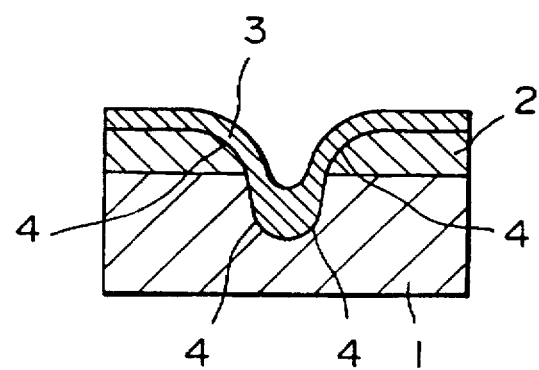

An alternative way to practice the inventive method when the height of the protrusion cannot be smaller than 200 µm is illustrated in FIGS. 1e and 1f. As is illustrated in FIG. 1e, the graphite layer 2 formed on the surface of a boron nitride substrate 1 is engraved together with the substrate 1 to form a groove having a depth larger than 200 µm and the edged or recessed corner lines 4 or ridges are chamfered and rounded to have a cross sectional profile of a smooth curve of which the radius of curvature in the cross section is not smaller than 0.5 mm at any portion by using an end mill used for milling works followed by the overall formation of the PBN-cladding layer 3 as is illustrated in FIG. 1f by the CVD method according to a known procedure.

In the following, examples are given to illustrate several embodiments of the inventive method although the scope of the invention is never limited by these examples in any way.

EXAMPLE 1

Figure 2:
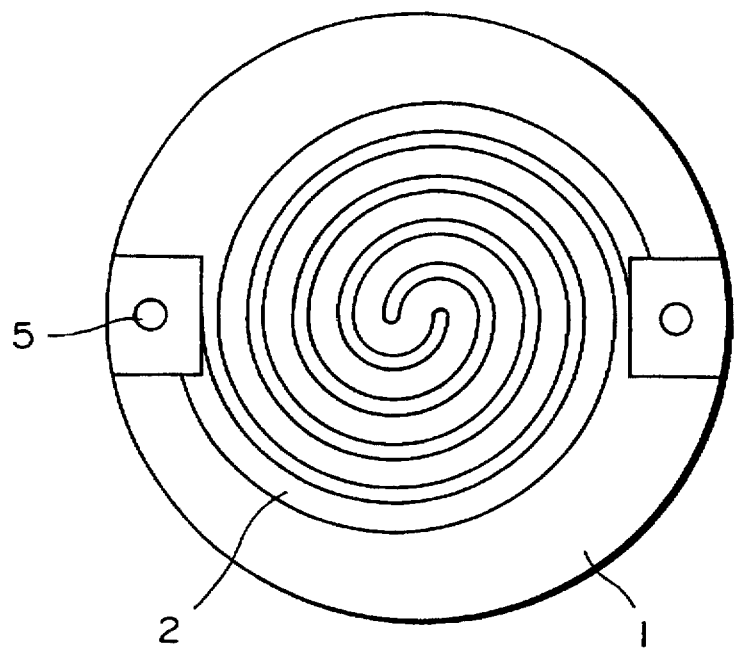
FIG. 2 is a plan view of a PBN-clad ceramic heater having a double-coated structure.

A circular disc of sintered boron nitride having a diameter of 200 mm and a thickness of 10 mm as a substrate was undercoated with a pyrolyric graphite layer having a thickness of 50 µm by the CVD method in which methane gas was treated at 2000° C. As is illustrated in FIG. 2, the thus graphite-coated substrate disc was subjected to a milling work to a depth of 1000 µm leaving the graphite layer in the form of a dual spiral 2 having a width of 3 mm to serve as a resistance heater element on the boron nitride substrate 1. Chamfering and rounding of the ridge lines were conducted along the whole length of the spiral pattern so that the radius of curvature in the cross sectional profile was equal to 0.5 mm along allover the length as is illustrated in FIG. 1e. In the next place, the thus mechanically worked disc was set in a CVD chamber to be provided with a cladding layer of PBN having a thickness of 100 µm at 1850° C. for 10 hours in an atmosphere of a gaseous mixture of boron trichloride, ammonia and hydrogen in flow rates of 1 SLM, 5 SLM and 20 SLM, respectively, under a pressure of 9.5 Torr to complete a PBN-clad PG heater having a cross sectional profile partially illustrated in FIG. 1f. The thus prepared PBN-clad ceramic heater provided with terminals 5 was subjected to a heat cycle test between 25° C. and 1000° C. in order to confirm the performance as a heat source for a vacuum furnace. The results of the heat cycle test, of which a cycle consisted of an interval of temperature elevation at a rate of 50° C./second from 25° C. up to 1000° C., an interval for keeping at 1000° C. for 5 minutes and an interval for temperature lowering to room temperature at a rate of 50° C./second, was that absolutely no troubles due to crack formation in or exfoliation of the PBN-cladding layer were encountered even after 20 cycles of the repeated heat cycle test.

COMPARATIVE EXAMPLE 1

The procedures for the preparation of a PBN-clad ceramic heater and the heat cycle test for the evaluation thereof were substantially the same as in Example 1 except that the radius of curvature along the ridge lines of the spiral pattern after the mechanical engraving work for the pattern was 0.3 mm instead of 0.5 mm. The result of the heat cycle test was that exfoliation of the PBN-cladding layer took place already after 5 times of the repeated heat cycles.

EXAMPLE 2

A disc of PBN having a diameter of 100 mm and a thickness of 1.2 mm as a substrate was set in a CVD chamber and an undercoating layer of pyrolytic graphite having a thickness of 50 µm was deposited on the surface of the substrate by the CVD method at 1900° C. for 7.5 hours in an atmosphere of a gaseous mixture of propane and hydrogen introduced into the chamber at flow rates of 5 SLM and 20 SLM, respectively, under a pressure of 12.5 Torr to give a PG-coated PBN disc having a cross section illustrated in FIG. 1b. The surface of the disc was engraved in a depth of 100 µm by using a square end mill pattern-wise to form a double spiral heater pattern as is illustrated in FIG. 2. The cross section of the thus engraved part is illustrated in FIG. 1e. The thus mechanically worked heater disc was set in a CVD chamber and provided with a PBN-cladding layer having a thickness of 50 µm at 1800° C. for 6 hours in an atmosphere of a gaseous mixture of boron trichloride, ammonia and hydrogen introduced into the chamber at flow rates of 1 SLM, 5 SLM and 20 SLM, respectively, under a pressure of 8.7 Torr to complete a ceramic heater by providing terminals. The thus prepared PBN-clad ceramic heater was subjected to a heat cycle test between 25° C. and 1000° C. in a vacuum chamber by passing electric current therethrough in the same manner as in Example 1. The results of the heat cycle test was that absolutely no troubles due to crack formation in or exfoliation of the PBN-cladding layer were noted even after 20 times of the repeated heat cycles.

COMPARATIVE EXAMPLE 2

A PBN-clad ceramic heater was prepared in substantially the same manner as in Example 2 except that engraving work of the double-spiral heater pattern shown in FIG. 2 was conducted by using a conventional square end mill in a depth of 300 µm. The heat cycle test of this PBN-clad ceramic heater undertaken in the same manner as in Example 2 resulted in exfoliation of the PBN-cladding layer already after a cycle of temperature elevation and lowering.

What is claimed is:

1. In a method for the preparation of a PBN-clad double-coated article comprising the steps of forming an undercoating layer of graphite on the surface of a substrate of boron nitride having an edged or recessed corner or ridge portion and then forming an overall cladding layer of pyrolytic boron nitride by chemical vapor deposition, the improvement which comprises smoothing the surface of the substrate to have a ruggedness not exceeding 200 µm in the height difference between the top of a protrusion and the bottom of a recess or chamfering and rounding the edged or recessed corner or ridge portion such that the radius of curvature thereof is not smaller than 0.5 mm.

2. In a method for the preparation of a ceramic heater which is an integral body consisting of a substrate plate of boron nitride, a line-wise patterned layer of graphite to serve as an electric resistance element formed on the substrate surface and a cladding layer of pyrolytic boron nitride covering allover the substrate surface and the graphite layer comprising the steps of forming a graphite layer on the surface of the substrate plate, mechanically engraving the graphite layer and the substrate plate therebelow in the line-wise pattern of the electric resistance element and forming the cladding layer of pyrolytic boron nitride by chemical vapor deposition, the improvement which comprises the depth of the mechanical engraving not exceeding 200 µm.

3. In a method for the preparation of a ceramic heater which is an integral body consisting of a substrate plate of boron nitride, a line-wise patterned layer of graphite to serve as an electric resistance element formed on the substrate surface and a cladding layer of pyrolytic boron nitride covering allover the substrate surface and the graphite layer comprising the steps of forming a graphite layer on the surface of the substrate plate, mechanically engraving the graphite layer and the substrate plate therebelow in the line-wise pattern of the electric resistance element and forming the cladding layer of pyrolytic boron nitride by chemical vapor deposition, the improvement which comprises chamfering and rounding the edged and recessed ridge lines formed by engraving in such a fashion that the cross sectional profile of the line-wise patterned layer is a smooth curve having a radius of curvature not smaller than 0.5 mm.

* * * * *